United States Patent [19]
Hiiragizawa

[11] Patent Number: 5,561,390
[45] Date of Patent: Oct. 1, 1996

[54] CLOCK SIGNAL GENERATION CIRCUIT HAVING DETECTIVE CIRCUIT DETECTING LOSS OF REFERENCE CLOCK

[75] Inventor: Yasunori Hiiragizawa, Tokyo, Japan

[73] Assignee: NEC Corporation, Tokyo, Japan

[21] Appl. No.: 329,858

[22] Filed: Oct. 27, 1994

[30] Foreign Application Priority Data

Oct. 28, 1993 [JP] Japan ..................................... 5-270715

[51] Int. Cl.⁶ ....................................................... H03L 7/06
[52] U.S. Cl. ............................. 327/147; 327/156; 327/20
[58] Field of Search ..................................... 327/141, 144, 327/145, 146, 149, 147, 148, 151, 155–157, 159, 160, 162, 163, 231, 233, 234, 236, 243, 244, 18, 20; 331/25

[56] References Cited

U.S. PATENT DOCUMENTS

| | | | |
|---|---|---|---|
| 4,791,386 | 12/1988 | Shiga ....................... | 327/156 |
| 5,008,635 | 4/1991 | Hanke et al. ............... | 331/1 A |
| 5,126,690 | 6/1992 | Bui et al. ................... | 331/1 A |
| 5,128,632 | 7/1992 | Erhart et al. ............... | 331/25 |
| 5,208,546 | 5/1993 | Nagaraj et al. ............ | 327/244 |
| 5,304,953 | 4/1994 | Heim et al. ............... | 331/25 |

FOREIGN PATENT DOCUMENTS

| | | |
|---|---|---|
| 355466 | 2/1990 | European Pat. Off. . |
| 2-112008 | 4/1990 | Japan . |
| 5-175949 | 7/1993 | Japan . |

OTHER PUBLICATIONS

Den Dulk, R. C., *Digital PLL Lock–Detection Circuit*, Electronics Letters, 1988, vol. 24, No. 14, pp. 880–882.

*Primary Examiner*—Timothy P. Callahan
*Assistant Examiner*—Eunja Shin
*Attorney, Agent, or Firm*—Foley & Lardner

[57] ABSTRACT

A clock signal generation circuit is disclosed which receives a reference clock and detects, in response thereto, the loss of the reference clock. A phase comparator 13, detects the phase difference between the reference clock signal and an stabilized clock from a PLL synthesizer, a signal DOWNB state of the phase comparator 13 is fixed to "0" level at the time of loss of the reference clock signal where the reference clock can be fixed to "0" or "1" level. The signal DOWNB is monitored using a reference clock loss detection circuit 12. If the signal DOWNB stays at the "0" level for a prescribed length of time, the reference clock loss detection circuit 12 judges that the reference clock is lost and brings an XTALFAIL signal to the active state.

10 Claims, 10 Drawing Sheets

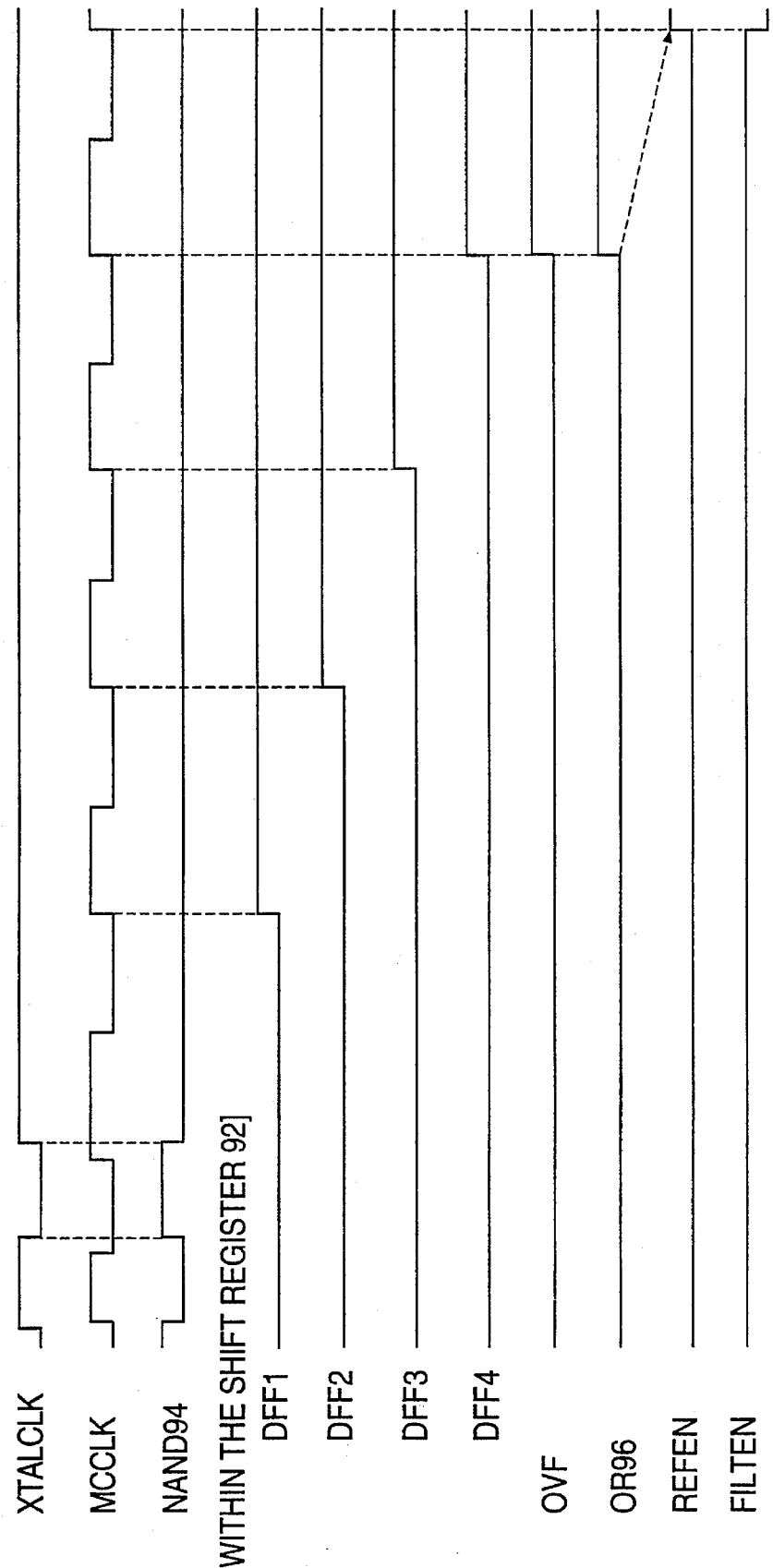

CLOCK SIGNAL GENERATION CIRCUIT HAVING DETECTIVE CIRCUIT DETECTING LOSS OF REFERENCE CLOCK

BACKGROUND OF THE INVENTION

1. Field of the Invention

The present invention relates to a clock signal generation circuit, and more particularly to a clock signal generation circuit used as a clock generator which receives a reference clock signal and generates a prescribed clock in response to the reference clock signal, and is equipped with a detective circuit to detect the loss of the reference clock.

2. Description of the Related Art

The clock signal plays the basic role in the operational sequence in, for example, a microcomputer system. As a clock source for generating the clock signal, is used to be made of a clock signal with certain duty cycle given by a crystal oscillator.

Recently, accompanying the increase in the clock rate of the clock signal, the clock signal is being made of a phase locked loop (referred to as "PLL" hereinafter) frequency synthesizer circuit which enables to obtain a stabilized high frequency clock using a relatively low frequency reference clock as an input. The PLL circuit is typically composed of a phase (and/or frequency) comparator (referred to as "PFC" hereinafter), a filter, a voltage controlled oscillator (referred to as "VCO" hereinafter) and a frequency divider circuit.

In this oscillator, a output clock signal with multiplied frequency is obtained based on the frequency of a reference clock signal generated by a reference oscillator, such as a crystal oscillator. However, the problem of these oscillators is the loss of the clock signal that is used as the reference of these oscillators. The reference clock signal generated by the crystal oscillator can be lost due to mechanical or some other reasons, which significantly affects the reliability of the system using the reference clock signal. It is for this reason that a technique of detecting the loss of the reference clock is disclosed in Japanese Laid-Open Patent Application No. Hei 2-112008. The contents of the application will be described briefly as a prior art in what follows.

A block diagram of a conventional clock generator is shown in FIG. 8. This clock generator includes an oscillator circuit (referred to as "X-OSC" hereinafter) 11, a clock signal detect and limp mode control circuit (referred to as "limp control circuit" hereinafter) 81 to generate a stable clock signal without the loss of an external reference clock signal, a phase comparator 82, a filter 83, a voltage control circuit (referred to as "VCC" hereinafter) 84, a VCO 16 and a frequency divider 17.

A crystal 10 is coupled between an EXTAL pin and an XTAL pin connected to the X-OSC 11. The X-OSC 11 outputs a reference clock signal XTALCLK. The reference clock signal XTALKCLK is inputted respectively to the limp control circuit 81 and the phase comparator 82. The frequency divider 17 outputs a divided clock signal MCCLK as its output signal. The divided clock signal MCCLK is also inputted respectively to the limp control circuit 81 and the phase comparator 82. The phase comparator 82 generates a signal LOCK and a phase error signal in accordance with the reference clock signal XTALCLK and the divided clock signal MCCLK, and the signal LOCK and the phase error signal are inputted to the limp control circuit 81 and the filter 83, respectively. The limp control circuit 81 generates a filter enable signal FILTEN and a reference voltage enable signal REFEN. The filter 83 generates a control voltage signal as its output in accordance with the phase error signal and the signal FILEN. The control voltage signal and one of the outputs, the signal REFEN, of the limp control circuit 81 are inputted to the VCC 84, and its output signal VCOIN is input to the VCO 16 as a control voltage. The VCO 16 generates as its output a controlled clock signal VCOCLK in accordance with the signal VCOIN which is input to the frequency divider 17 that generates the divided clock signal MCCLK. Further, the VCO 16 gives various clock signals used in a clock control circuit in the system (not shown specifically).

The device shown in FIG. 8 performs the well-known operation as a PLL frequency synthesizer if the operations of the limp control circuit 81 and the voltage control circuit 84 were absent. The loop circuit comprising the phase comparator 82, the filter 83, the VCO 16 and the frequency divider 17 receives the reference clock signal XTALCLK as a frequency reference signal and generates a synthesized controlled clock signal VCOCLK. The frequency of the controlled clock signal VCOCLK is related to the frequency of the reference clock signal XTALCLK. Namely, if the frequency divider 17 outputs an n-demultiplied clock with respect to the input clock, then, in the phase locked state, the frequency F of the controlled clock signal VCOCLK is determined in terms of the frequency f of the reference clock signal XTALCLK according to the following equation.

$$F = n \times f \qquad (1)$$

The design, manufacture and operation of the PLL frequency synthesizer are the technologies well known in the semiconductor industries, so that it will be unnecessary to give a further detailed description.

Now, if the reference clock signal XTALCLK is lost, the limp control circuit 81 detects the event and changes the signal REFEN from the inactive to the active level. As a result of the shift of the signal REFEN to the active level, the voltage control circuit 84 changes over the control voltage to be given to the VCO 16 from a voltage based on the output signal of the filter 83 to a voltage based on the signal REFEN of the VCC 84. This means that the loop condition no longer exists, and the output of the VCO 16 is a clock signal which does not depend on the reference clock signal XTALCLK, with its frequency determined by the reference voltage generated by the VCC 84. This frequency of the voltage control clock signal VCOCLK based on the signal REFEN is generally set, although not always the case, to give the voltage control clock signal VCOCLK with a frequency which is much lower than that given in the normal operation mode. The purpose of changing frequency of the voltage control clock signal VCOCLK is to provide an operation in which sequentially correct stoppage of the functions of the system (as data processing unit 1) or the continuation of operation of the system at a low level processing capacity can be attained, rather than to aim at maintaining of the system operation as well as the normal operation mode.

FIG. 9 shows a block diagram of the limp control circuit 81. The input to the limp control circuit 84 comprises the signals XTALCLK, MCCLK, RST and LOCK. The signal RST is a signal which is generated when the phase locked condition is destroyed corresponding to the starting up the system or an intentional external factor such as the change of the frequency division ratio, clock stoppage or the like by user or user program. The remaining signals have been described in the above.

The signal LOCK and the signal RST are inputted to the set input and the reset input terminals, respectively, of a flip-flop 91 (referred to as "FF" hereinafter) 91.

A shift register 92 which receives the reference clock signal XTALCLK to its IN input terminal, the divided clock signal MCCLK to its CLK input terminal, and the output of an inverted AND (referred to as "NAND" hereinafter) gate 94 which is obtained by NOT-ANDing the output of the FF 91 and the reference clock signal XTALCLK to its input terminal RES, and a shift register 93 which receives the output of a NAND gate 94 to its IN input terminal, the signal MCCLK to its input terminal CLK, and the output of a NAND gate 95 which is obtained by NOT-ANDing the output of the FF 91 and the output of the NAND gate 94 to its input terminal RES, input the overflow (referred to as OVF hereinafter) outputs from their respective shift registers to an OR gate 96, and the output of the OR gate 96 is inputted to a limp mode control signal generating circuit 97. The limp mode control signal generating circuit (referred as to "LMCSGC" hereinafter) 97 eventually generates and outputs control signals REFEN and FILTEN in response to the input from the OR gate 96.

The FF 91 plays the role of a register which indicates that the PLL is brought to the locked condition during the system starting up, the FF 91 is reset by bringing the RST signal goes to the active level when the locked condition of the PLL does not hold. The FF 91 is set by the LOCK signal goes to active in the locked state wherein the phase difference is found to fall within a prescribed error range by the phase comparator (shown in FIG. 8). In this way, the loss of the reference clock during the period of transition to the phase locked condition is not detected.

If the output of the FF 91 is "0" (at the inactive level) when the RST signal goes to active level, the outputs of the NAND gate 94 and the NAND gate 95 are both "1" (at active level), and the shift registers 92 and 93 are reset. Since the OVF outputs of both the shift registers 92 and 93 are at the "0" level, the output of the OR gate 96 is also at the "0" level. The LMCSGC 97 functions so as to output a "0" level signal REFEN and a "1" level signal FILTEN when "0" is input. Therefore, this clock generator functions as a PLL synthesizer, and the loop operates toward phase locked condition.

Once the loop is brought to the phase locked condition, the FF 91 is set, its output goes to the "1" level, and the outputs of the NAND gates 94 and 95 are determined by the state of the FF 91 and the state of the reference clock signal XTALCLK. Namely, at this time, the output of the NAND gate 94 is the inversion of the reference clock signal XTALCLK, and the output level of the NAND gate 95 which is the inversion of the output of the NAND gate 94 coincides with the level of the reference clock signal XTALCLK. Accordingly, the shift register 92 is released from the reset condition when the level of the reference clock signal XTALCLK goes to "1", the shifting operation of the shift register 92 is active, and conversely, the shift register 93 is released from the reset condition when the level of the reference clock signal XTALCLK goes to "0" the shifting operation of the shift register 93 is active.

The operation of the shift registers 92 and 93 is to count the continued duration of the "1" level of the signal given to the input terminal IN during the "0" level of the RST signal, using the clock given to the CLK input terminal.

An example of the configuration of the shift register is shown in FIG. 10. The shift register comprises D-Flip Flop latches (referred to as "DFFs" hereinafter) 101, 102, 103 and 104, and an AND gate 105. An input terminal CLK of the shift register 92 is connected to all input terminals CLKT of the DFFs 101, 102, 103 and 104, and an input signal RES is connected to all input terminals REST, an input terminal D of the DFF 101 is connected to the input terminal IN, its output Q is connected to the input terminal D of the DFF 102, the output Q of the DFF 102 is connected to the input terminal D of the DFF 103 and the output Q of the DFF 103 is connected to the input terminal D of the DFF 104. In addition, all of the outputs Q of the DFFs are connected to the inputs of the AND gate 105. During the period over which the signal inputted to the input terminal REST is at the "1" level, the output Q of each DFF goes to the "0" level, and the OVF signal which is the output of the AND gate 105 goes to the "0" level. As the input signal inputted to the input terminal REST goes to the "0" level, the data level of the input terminal D is shifted successively corresponding to the CLK input. The OVF signal which is the output of the AND gate 105 goes to the "1" level when all of the outputs Q of the DFFs are at the "1" level, which occurs when "1" level signals are kept input over four clock periods according to the clock of the input terminal CLKT.

Now, when the reference clock signal XTALCLK is given properly, the shift registers 92 and 93 described in the above are normally in a state where the frequencies of the reference clock signal XTALCLK and divided clock signal MCCLK are nearly equal. Therefore, the signal OVF is not generated from the shift registers 92 and 93, and they are mutually reset alternately corresponding to the changes in the reference clock signal XTALCLK level. Accordingly, the output of the OR gate 96 is always at the "0" level. Once the reference clock signal XTALCLK stays at the "1" level, the reset of the shift register 92 is released to perform the shifting operation to count the period of the reference clock signal XTALCLK level at the "1" corresponding to the divided clock signal MCCLK, generating an OVF of the shift register 92 to bring the output of the OR gate 96 to the "1" level. The shift register 93 is similarly the shift register 92. That is, the system described above possesses the function of detecting the loss of the reference clock. The LMCSGC 97 controls the output signals REFEN and FILTEN in response to the output "1" of the OR gate 96, and brings the signal REFEN to the "1" level and the signal FILTEN to the "0" level.

The operational timings of the limp control circuit 81 shown in FIG. 9 are given in FIG. 11. FIG. 11 shows the case when the reference clock signal XTALCLK is fixed to the "1" level. When the reference clock signal XTALCLK continues to remain at the "1" level, the output of the NAND gate 96 continues to stay at the "0" level, and the reset of the shift register 92 continues to be released. Moreover, since the level "1" of the reference clock signal XTALCLK continues to be given at this time to the IN input of the shift register 92, the shift register 92 sequentially shifts the data in response to the clock of the signal MCCLK and generates an OVF after four counts of the MCCLK signal, bringing the output of the OR gate 96 to the "1" level. In response to this, the LMCSGC 97 brings the signals REFEN and FILTEN to the "1" and the "0" levels, respectively.

When the reference clock signal XTALCLK continues to stay at the "0" level, the shift register 93 performs an operation similar to the shift register 92 as mentioned above.

As described in the above, the limp mode control circuit achieves the detection of the loss of the reference clock signal by two shift registers which measure the periods corresponding to the respective levels, the "0" and the "1" levels in this case, at the time of its detection.

Generally, the output signal of a crystal oscillator is used to a reference clock signal, it is not possible to determine the level at the time of loss of the reference clock signal to be fixed to the "0" level or the "1" level. Therefore, in the conventional device, the reference clock signal is observed directly two measuring means for measuring the respective periods of the "0" and "1" levels of the reference clock signal level at the time of loss of the reference clock signal, which leads to a drawback that a circuit area becomes large.

SUMMARY OF THE INVENTION

It is therefore the object of this invention to eliminate such a drawback by taking advantage of the fact that the output of the phase comparator stays alway fixed due to equivalence of the loss of the reference clock and the frequency of the reference clock signal being equal to zero, and detect the loss of the reference clock by monitoring and measuring the output of the phase comparator. Consequently, measurement of one state suffices instead of the measurement of the respective ones of the two states in the prior art, thereby simplifying the required means and reducing the scale of the circuit.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 11 is an operational timing chart of the conventional limp mode control circuit shown in FIG. 8.

DESCRIPTION OF THE INVENTION

Figure 1:
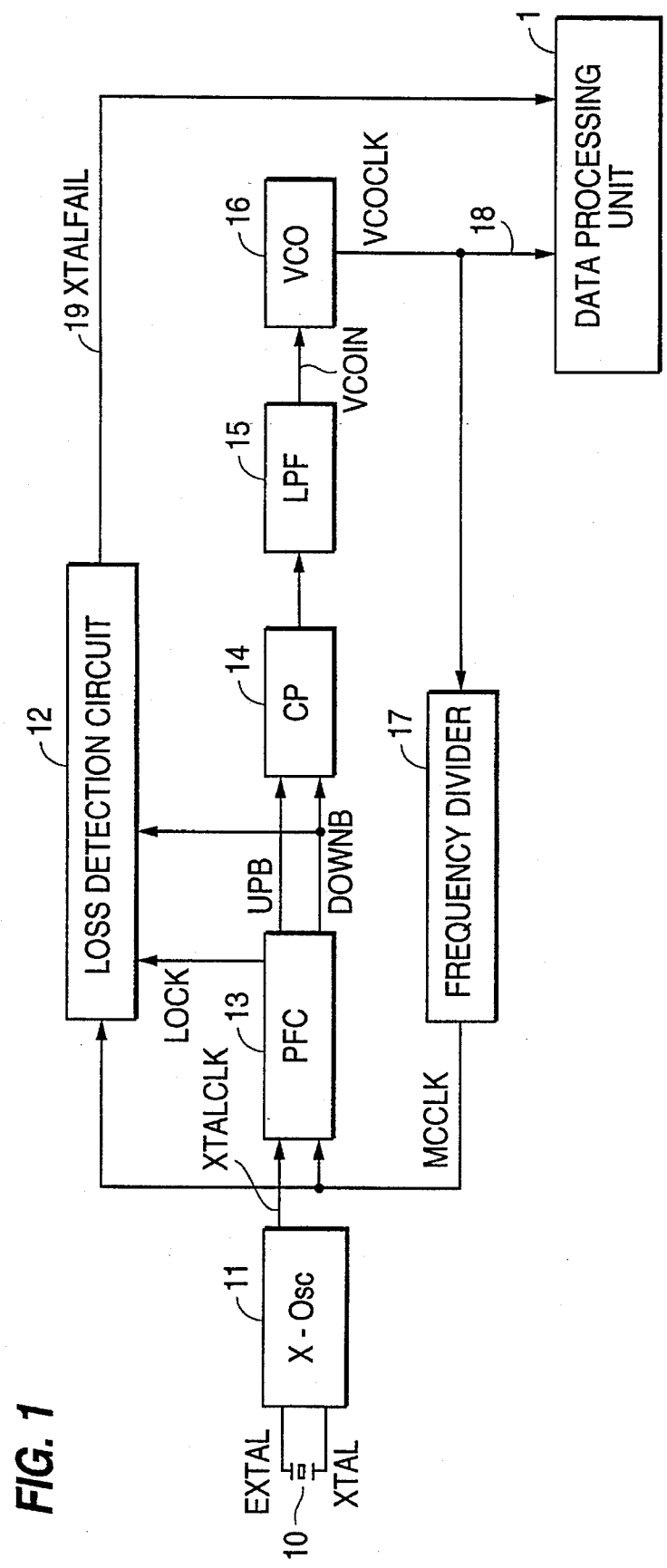
FIG. 1 is a block diagram of the semiconductor device according to this invention.

Next, referring to the drawings, an embodiment of this invention will be described.

FIG. 1 is an overall block diagram showing an embodiment of this invention. This circuit includes an X-OSC 11, a reference clock loss detection circuit (referred to as "loss detection circuit" hereinafter) 12 for reference clock loss, a PFC 13, a charge pump circuit (referred to as "CP" hereinafter) 14, a low pass filter (referred to as "LPF" hereinafter) 15, a VCO 16 and a frequency divider 17.

A crystal 10 is coupled between an EXTALCLK pin and an XTALCLK pin connected to the X-OSC 11. The X-OSC 11 outputs a reference clock signal XTALCLK. The reference clock signal XTALCLK is inputted to the PFC 13 as one input. The frequency divider 17 outputs a divided clock signal MCCLK. The divided clock signal MCCLK is inputted to the PFC 13 as the other input. The PFC 13 generates a signal LOCK, and signals UPB and POWNB based on the reference clock signal XTALCLK and the divided clock signal MCCLK which are phase error signals The signal LOCK is inputted to the loss detection circuit 12 and the signals UPB and DOWNB are inputted to the respective input terminals of the CP 14. The output of the CP 14 is inputted to the LPF 15, and the LPF 15 gives its output to the VCO 16 as the control voltage VCOIN for the VCO 16. The VCO 16 outputs a controlled clock signal VCOCLK 18 as a clock with frequency corresponding to the signal VCOIN and supplies it to the frequency divider 17 that generates the divided clock signal MCCLK. The clock signal VCOCLK 18 is then applied to a data processing unit 1.

The circuit in FIG. 1 represents a circuit well-known as a PLL synthesizer except for the loss detection circuit 12. Namely, the PLL synthesizer is constituted of the PFC 13, CP 14, LPF 15, VCO 16 and frequency divider 17 receives the signal XTALCLK as a frequency reference signal and generates a synthesized signal VCOCLK. During the normal operation, the operation of this PLL synthesizer has the same function as the operation of the conventional device does.

Now, assume that there occurred a loss of the reference clock signal XTALCLK. What is meant by loss here is defined as the state in which the reference clock signal XTALCLK is fixed to the "0" or "1" level and the crystal 10 no longer generates a clock signal.

First, the operation of the PFC 13 in that case will be described.

Figure 2:
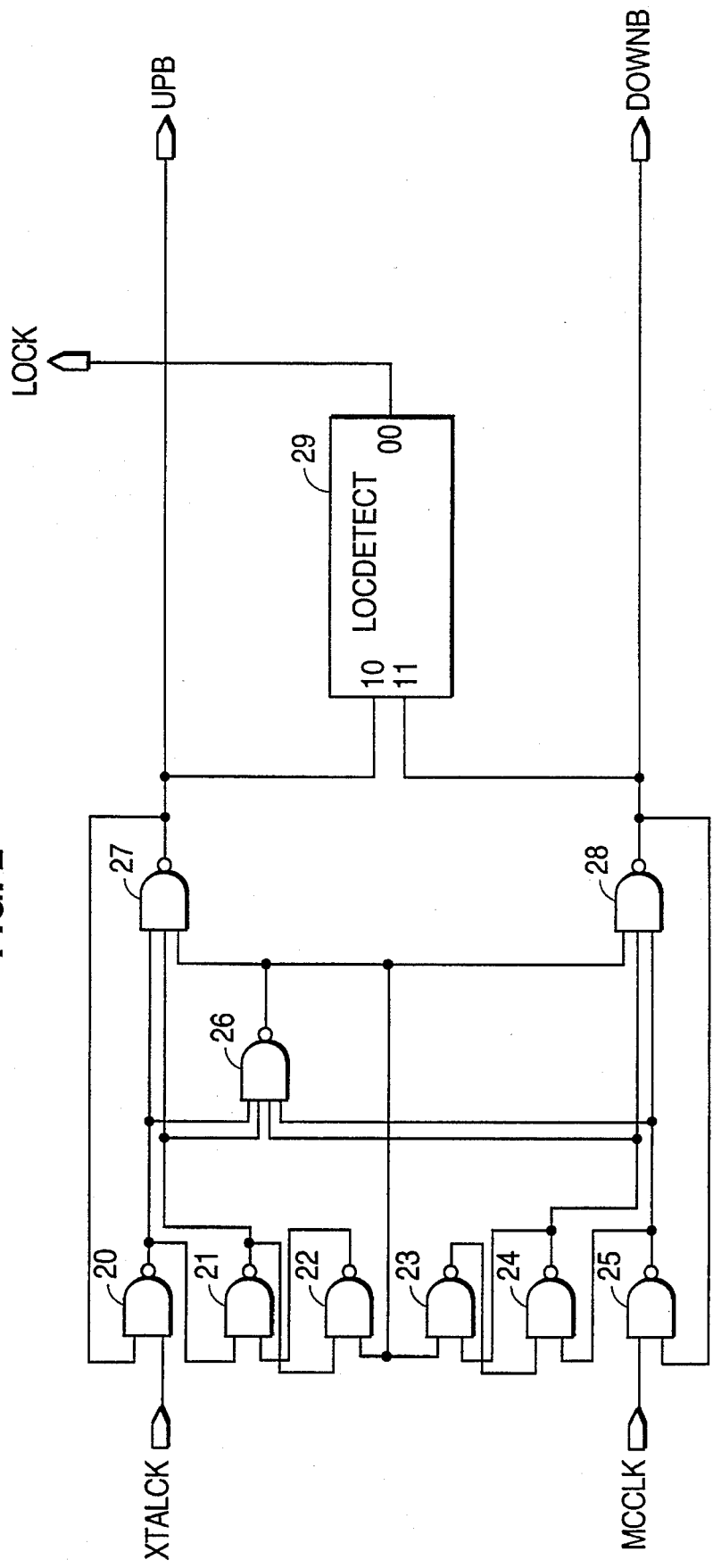
FIG. 2 is a circuit diagram of a PFC shown in FIG. 1.

FIG. 2 shows a circuit which is generally well-known as a PFC. This circuit is what is used in Type MC4044 made by Motorola, which is cited widely. Namely, this PFC 13 includes NAND gates 20, 21, 22, 23, 24, 25, 26, 27, 28 and a lock detection circuit (referred to as "LOCDETECT" hereinafter) 29. The NAND gate 20 receives the reference clock signal XTALCLK and the output of the NAND gate 27 as the inputs, and its output is inputted to the input terminals of the NAND gates 21, 26 and 27. The NAND gates 21 and 22, and the NAND gates 23 and 24 form flip-flop latches in which the respective outputs are inputted to the inputs of each other. The output of the NAND gate 21 is inputted to the respective input terminals of the NAND gates 26 and 27. The NAND gate 25 has the divided clock signal MCCLK and the output of the NAND gate 28 as its inputs. The output of the NAND gate 25 is inputted to the input terminals of the NAND gates 24, 26 and 28. The output of the NAND gate 24 is inputted to the input terminals of the NAND gates 26 and 28, and the output of the NAND gate 26 is inputted to the input terminals of the NAND gates 22 and 23, thereby playing the role of the reset signal for the flip-flop latches formed respectively by the NAND gates 21 and 22, and NAND gates 23 and 24. The output of the NAND gate 26 is also inputted to the respective input terminals of the NAND gates 27 and 28. The signal UPB of the NAND gate 27 and the signal DOWNB of the NAND gate 28 are also inputted to the input terminals of the LOCDETECT 29, and as a result, the LOCDETECT 29 outputs the signal LOCK.

Figure 3A:
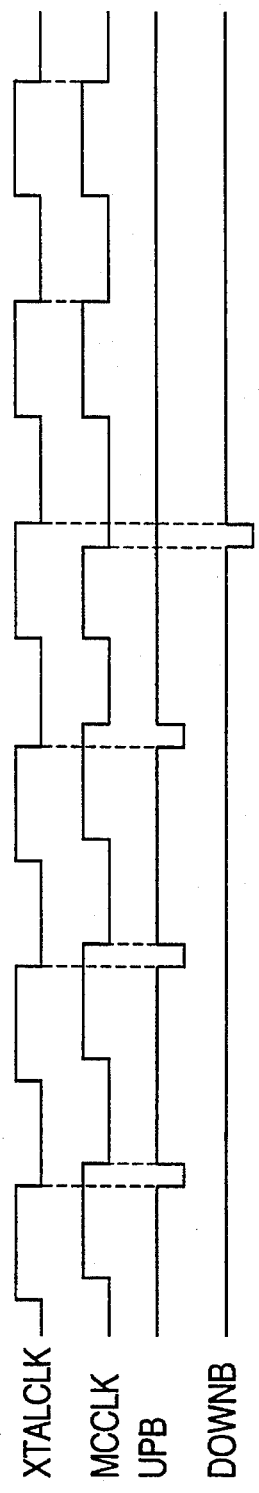
FIG. 3 is an operational timing chart of the PFC shown in FIG. 2, wherein FIG. 3($a$) is a chart during operation of the reference clock signal XTALCLK, FIG. 3($b$) is a chart when the reference clock signal XTALCLK is fixed to the "0" level and FIG. 3($c$) is a chart when the reference clock signal XTALCLK is fixed to the "1" level.

The LOCDETECT 29 is to detect from its error signals whether the loop is brought to the phase locked condition, and outputs a signal of the "1" level in the phase locked state. The signals UPB and DOWNB are error signals, and the signal UPB is brought to the "0" level when the divided clock signal MCCLK lags behind the reference clock signal XTALCLK, and conversely, the signal DOWNB is brought to the "0" level when the divided clock signal MCCLK leads the reference clock signal XTALCLK. Moreover, if the phases of both input clocks are equal, both signals UPB and DOWNB go to the "1" level. More specifically, the trailing edges are compared in this circuit, so that the width of the "0" level of the signals UPB and DOWNB becomes the difference of the trailing edges of the reference clock signal XTALCLK and the divided clock signal MCCLK, and whether the signal UPB or DOWNB becomes active is determined by which of the reference clock signal XTALCLK and the divided clock signal MCCLK fell first. If the reference clock signal XTALCLK fell earlier, the signal UPB goes to the "0" level, and conversely, if the divided clock signal MCCLK fell earlier, the signal DOWNB goes to the "0" level. An example of the operational timings is shown in FIG. 3(a). The operation, not only of this circuit, but also of the PFC 13 in general, is shown by which phase of the clocks is leading as determined by the use of two signals such as UPB and DOWNB, and the phase difference is represented basically by the active period of the leading clock (it is not necessary that the active period itself is equal to the phase difference itself, but suffices if the active period is proportional to the phase difference). As can be seen clearly, if, for example, the divided clock signal MCCLK fell first and, after the signal DOWNB became active, the reference clock signal XTALCLK does not fall before the divided clock signal MCCLK falls again, then the signal DOWNB will become a continuous one. Now, the fact that the reference clock signal XTALCLK is fixed to the "0" or "1" level can be regarded that the reference clock signal XTALCLK has a clock waveform of frequency zero.

Figure 3B:
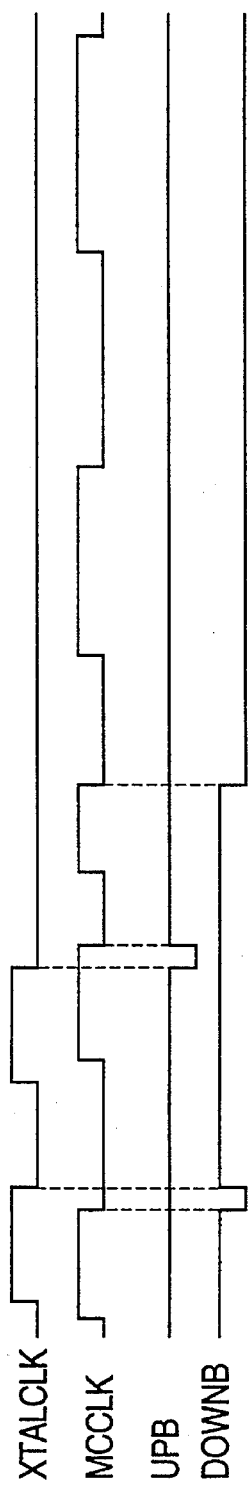
Figure 3C:
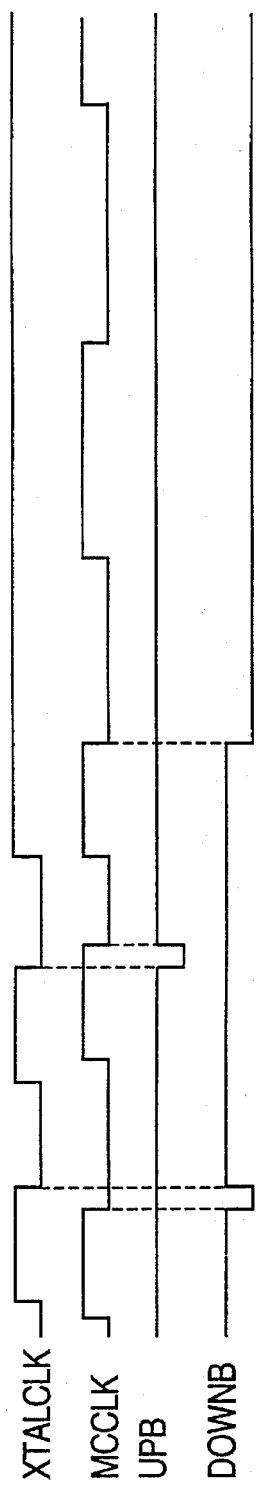

Accordingly, the phase of the reference clock signal XTALCLK then lags behind that the divided clock of MCCLK, the signal DOWNB goes to the active "0" level and the phase difference becomes infinity, so that the signal DOWNB continues to hold the "0" level. The operational timings of the PFC 13 at that time are shown in FIGS. 3(b) and 3(c). It can be seen from these figures that for the respective cases of the reference clock signal XTALCLK being fixed to the "0" and "1" levels, the signal DOWNB continues to hold the active "0" level.

Figure 4:
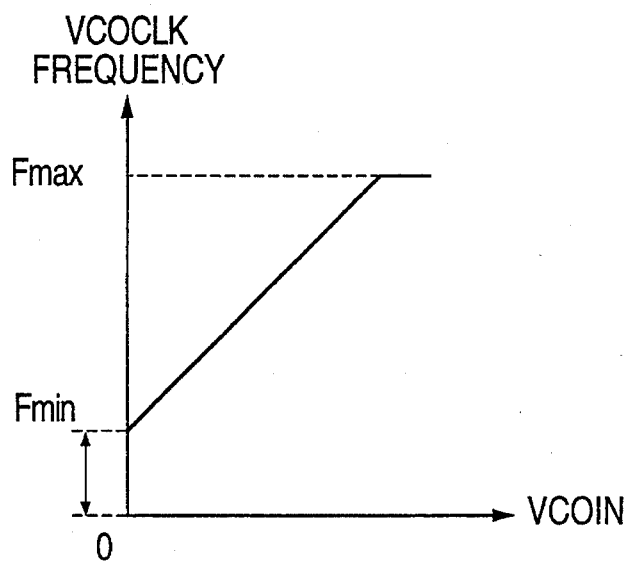
FIG. 4 is a diagram showing the dependence of the oscillation frequency on the input control voltage of the VCO shown in FIG. 1.

Turning back to FIG. 1, the operation of the PLL synthesizer will be now described. As described above, the PFC 13 generates the signals UPB or DOWNB in response to a difference between the phases and/or the frequencies of the signals LOCK and MCCLK to control the control voltage VCOIN of the VCO 16. The oscillation signal VCOCLK is thus controlled. When the signal UPB becomes active, the level of the signal VCOIN is raised to increase the frequency of the signal VCOCLK. When the signal DOWNB becomes active, on the other hand, the level of the signal VCOIN is lowered to decrease the frequency of the signal VCOCLK. If the signal DOWNB continues to be active, the level of the signal VCOIN continues to be lowered and finally reaches the minimum level. In this embodiment, this minimum level of the control signal voltage VCOIN is designed to be zero. The VCO 16 is thereby brought into a free-running state to produce the clock signal having the free-running frequency. This frequence is represented by "Fmin" as shown in FIG. 4. As is also apparent from FIG. 4, the control signal voltage VCOIN reaches its maximum level to change the clock signal VCOCLK up to a maximum frequency Fmax.

Figure 5:
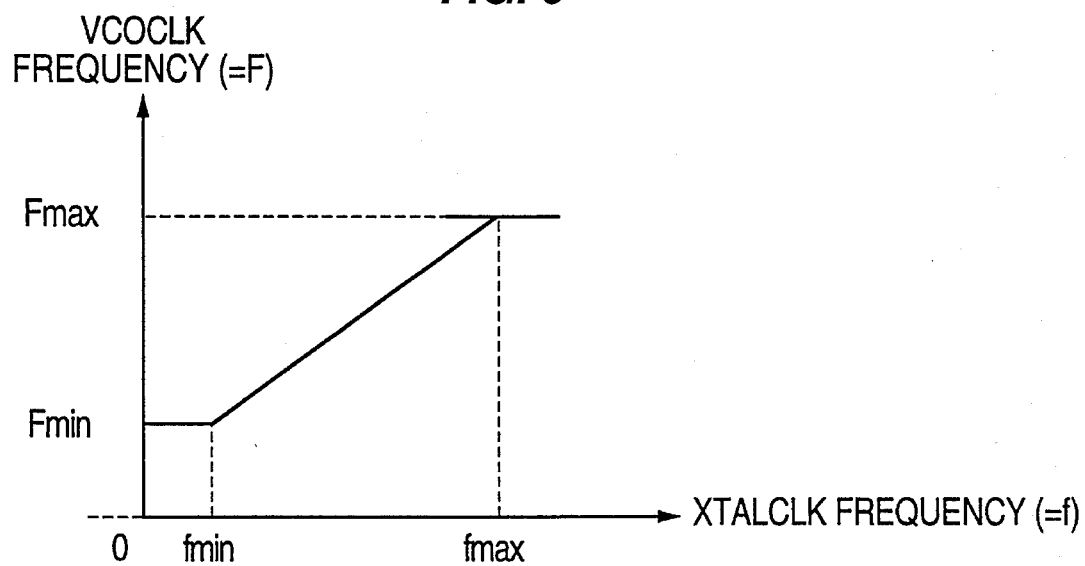
FIG. 5 is a diagram showing the dependence of the output frequency on the reference input frequency of the PLL synthesizer shown in FIG. 1.

Since the clock signal VCOCLK depends on the reference clock signal XTALCLK, the relationship as shown in FIG. 5 is derived therebetween. Specifically, in the frequency range of 0 to fmin of the reference clock signal XTALCLK the PLL synthesizer outputs a signal with frequency Fmin in the self-running condition irrespective of the clock frequency of the reference clock signal XTALCLK. As the frequency of the reference clock signal XTALCLK exceeds fmin, the PLL circuit makes a transition from the lock range (range over which the output follows corresponding to the input frequency) to the capture range (range over which the circuit can enter the phase locked condition for the input frequency) and settles in the phase locked state determined by the frequency of the signal VCOCLK corresponding to the frequency of the reference clock signal XTALCLK. The relation between the frequencies is shown in Eq.(1) for the prior art. With the further increase in the frequency of the reference clock signal XTALCLK, the frequency of the signal VCOCLK reaches the oscillation limit frequency Fmax, and no oscillation can take place for a higher frequency of the reference clock signal XTALCLK. However, considering the fact that normally in most of the cases the reference clock signal XTALCLK has a fixed frequency given by a crystal oscillator, one needs only to deal with the case in which the frequency of the reference clock signal XTALCLK lies in the range from 0 to fmax in the figure. Therefore, when considering the operation of the system, the frequency fn, where fmin<fn<fmax, of its normal operation of the 0 frequency at the time of loss of the reference clock signal can be considered as the frequency of the reference clock signal for the system, and the frequency of the signal VCOCLK at the loss of the reference clock signal becomes the offset self-running frequency Fmin. In other words, in a PLL synthesizer constituted as in the above, oscillation will never be stopped even at the loss of the reference clock.

As in the above, it has been seen that the PLL synthesizer components of FIG. 1 continues to oscillate even at the time of loss of the reference clock signal, and that the output signal DOWNB of the PFC 13 goes to the active "0" level. Utilizing this fact, the loss detection circuit 12 detects the reference clock signal loss by measuring the "0" period of the signal DOWNB.

Figure 6:
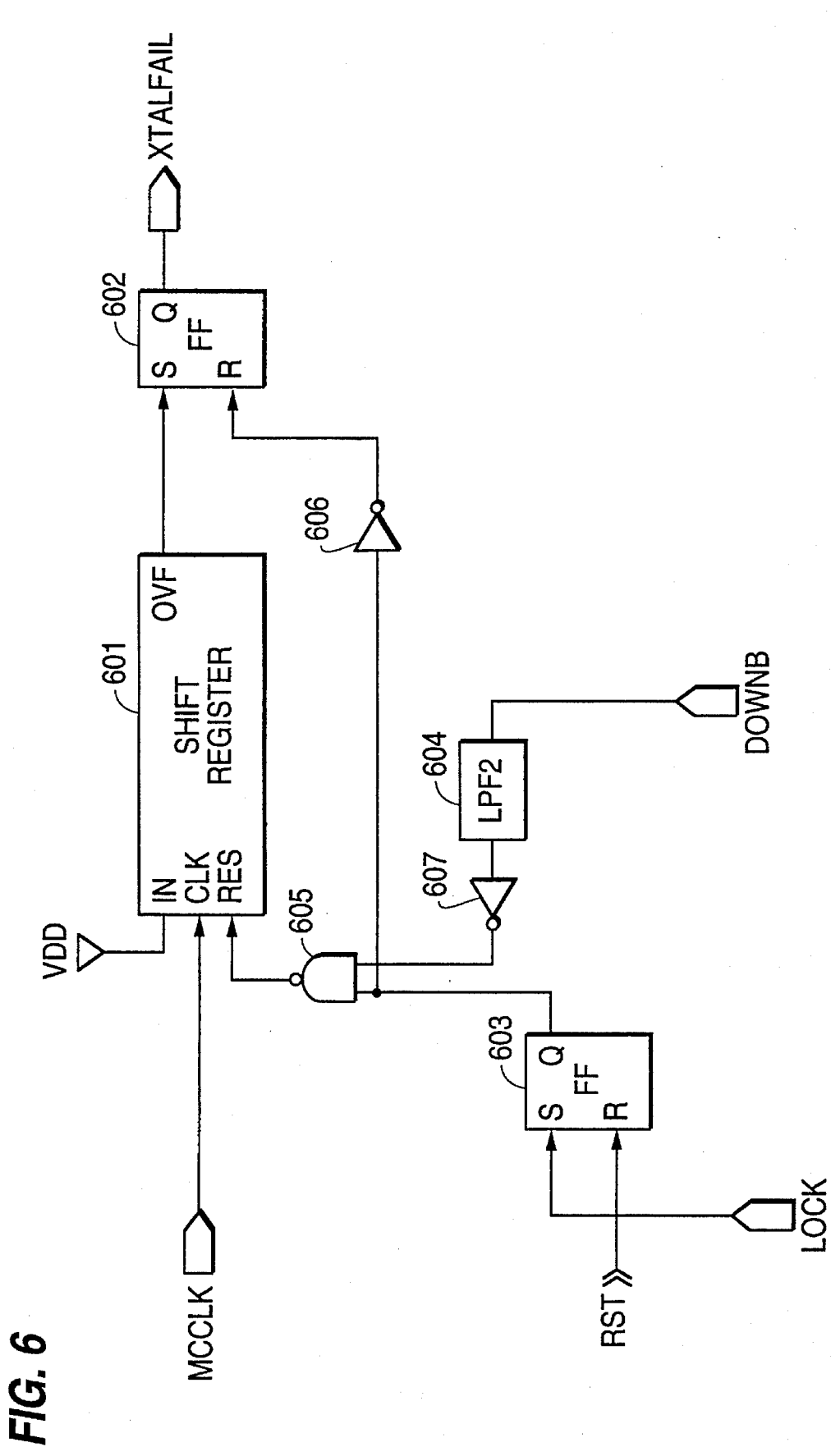
FIG. 6 is a block diagram of the reference clock detection circuit of the embodiment of this invention.

In FIG. 6 is shown a block diagram of the loss detection circuit 12. This loss detection circuit 12 is constituted of a shift register 601, FFs 602 and 603, an LPF 604, a NAND gate 605 and inverter elements (referred to as "INV" hereinafter) 606 and 607. The shift register 601 is the same as the shift register shown in the prior art, and the IN input terminal is connected to the VDD level, the CLK input terminal to the divided clock signal MCCLK and the output of the NAND gate 605 to the RES input terminal. The FF 603 has the signal LOCK inputted to the set input terminals and the signal RST which becomes active at the start from an unlocked state such as rise of the system is inputted to the reset input R1 having a function similar to the prior art FF 91, and its Q output is inputted to an input terminal of the NAND gate 605. The LPF 604 has the signal DOWNB as its input, and outputs a noise eliminated signal. The output of the LPF 604 is input to the INV 607, and is inputted after inversion to the NAND gate 605.

The reason for inserting the LPF 604 is that the output signals UPB and DOWNB of the PFC 13 are not made completely inactive in general even in the phase locked state, and active pulses are generated all the time due to the feedback applied to keep the PLL circuit always in the phase locked condition. In measuring the width of such pulses, unnecessarily short pulses are undesirable because they may cause malfunctions of the circuit, and the purpose of the LPF 604 is to remove pulses with a width smaller than a certain value.

The output of the FF 603 is also inputted to the input of the INV 606. The FF 602 receives the output of the INV 606 in its reset input and the OVF output of the shift register 601 in its set input, and its Q terminal outputs the XTALCLK.

Next, the operation of the loss detection circuit 12 will be described.

Figure 7:
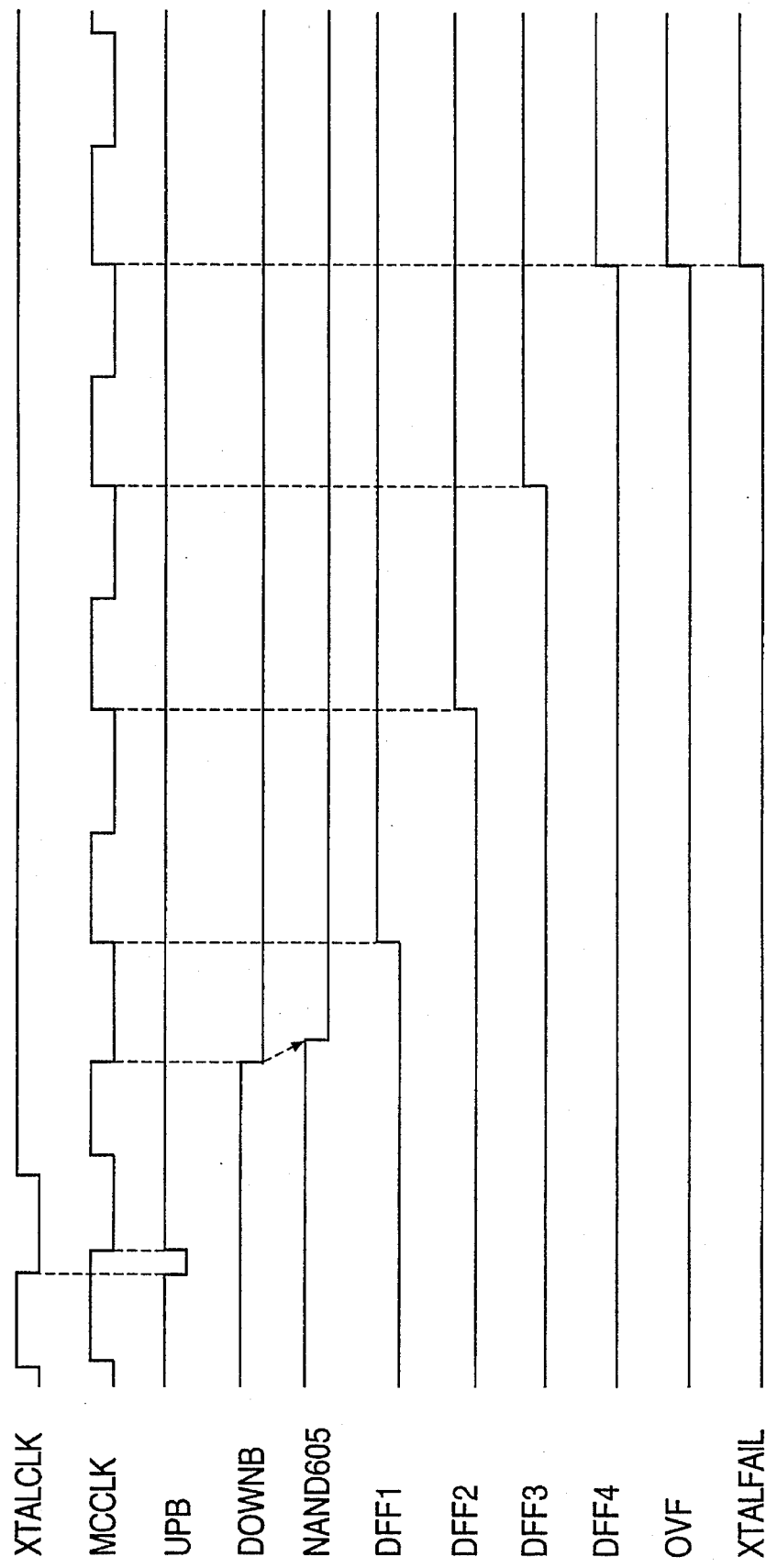
FIG. 7 is an operational timing chart of the reference clock detection circuit.
Figure 10:
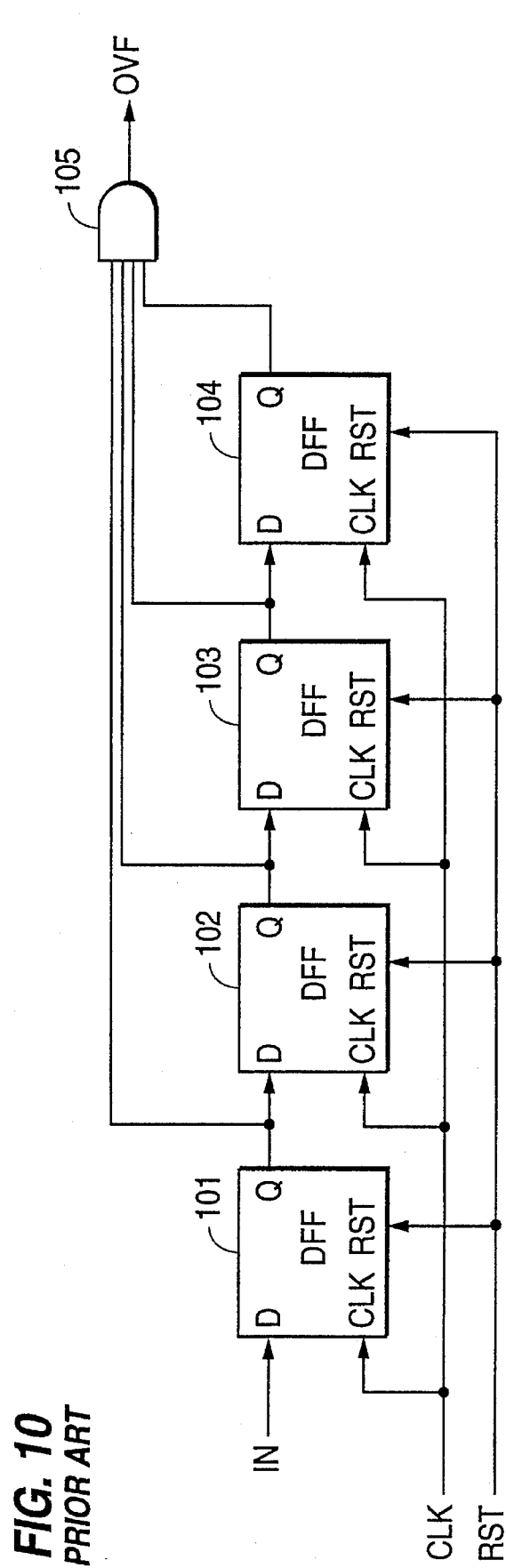
FIG. 10 is a circuit diagram of the conventional shift register shown in FIG. 8.

The FF 603 is reset at the rise of the system, and its output Q goes to the "0" level. As a result, both outputs of the NAND gate 605 and the INV 603 go to the "1" level, and the shift register 601 and the FF 602 are reset. When the PLL circuit is phase locked after the signal RST became inactive, the LOCK signal becomes active, the FF 603 is set and its output Q goes to the "0" level. Accordingly, the output of the INV 606 goes to the "0" level and the reset of the FF 602 is released. In addition, the output of the NAND gate 605 is determined by the output of the INV 607, and when seen from the level of the signal DOWNB, the logical level of the NAND gate 605 coincides with that of the signal DOWNB. Therefore, the shift register 601 is reset when the signal DOWNB is at the "1" level, and the reset is released when the signal DOWNB is at the "0" level. When the shift register 601 has the configuration as shown in FIG. 10, generation of an OVF from the shift register 601 occurs when the signal DOWNB holds at the active "0" level during the four clock periods of the divided clock signal MCCLK. As seen in FIG. 3(a), such an event will not occur during the phase locked condition of the circuit. An OVF from the shift register 601 occurs when the signal DOWNB continues to hold at the "0" level. A timing chart corresponding to this situation is shown in FIG. 7.

It is shown by the figure that an OVF occurs at the fourth clock of the divided clock signal MCCLK after the signal DOWNB went to the "0" level, the FF 602 is set and a signal XTALFAIL goes to the active "1" level.

This active "1" signal XTALFAIL is in turn supplied to the data processing unit 1. In response thereto, the unit 1 can give an alarm the outside. Further, the unit 1 may perform a processing, for example, a back-up mode other than the regular routine, specified by an interrupt routine or the like by regarding the signal XTALFAIL as an interrupt signal, or for processing the execution of the routine of the stoppage operation of the system.

As described in the above, this invention shows that it is possible to achieve the detection of the loss of reference clock with an effect comparable to that of the prior art using a circuit of scale which is about one half of the conventional circuit by making an advantageous use of the fact that the state of the PFC at the time of loss of the reference clock can be determined uniquely.

This means that this invention brings about various advantages such as reduction of the cost and the current consumption due to the downsizing of the chips in the recent years, and the diminishing of the failure rate in the sense of reduction of the element number itself.

Figure 8:
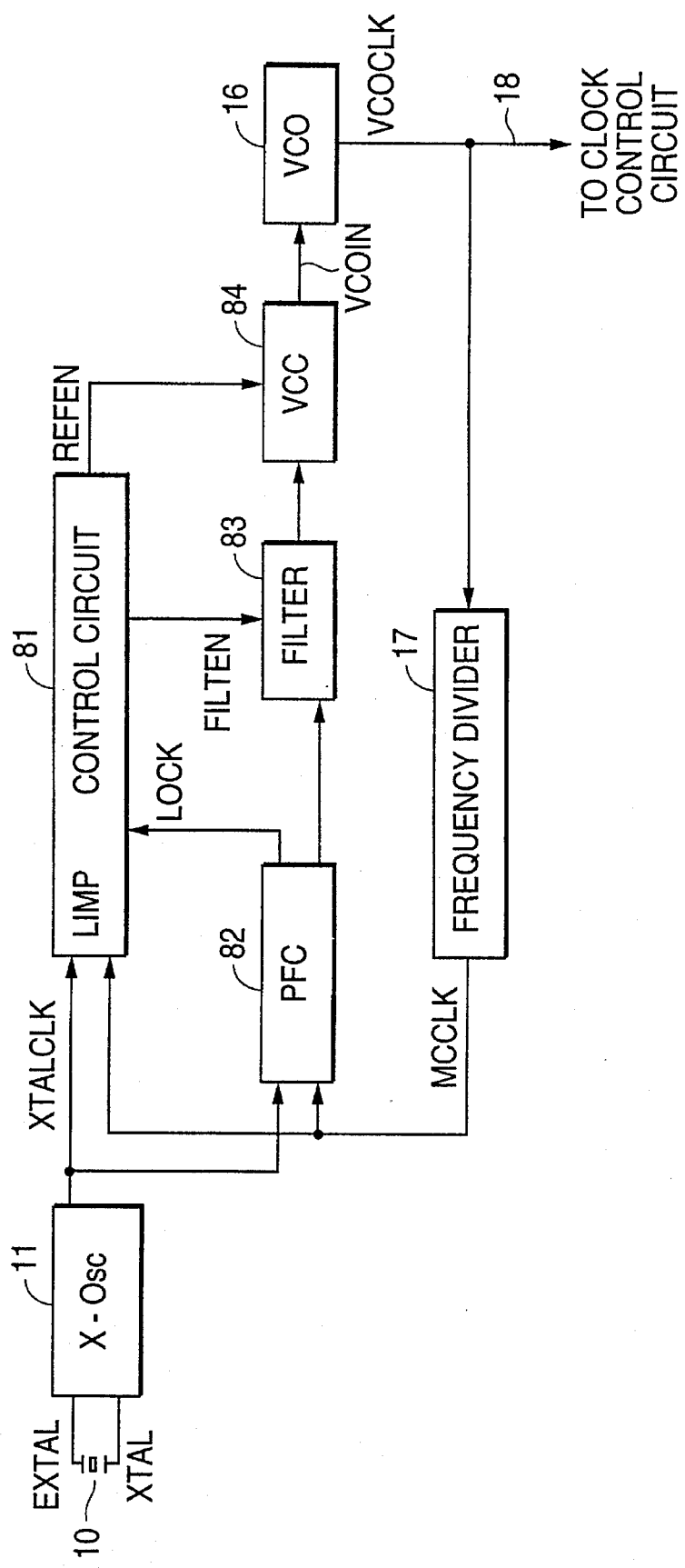
FIG. 8 is a block diagram of the prior art.
Figure 9:
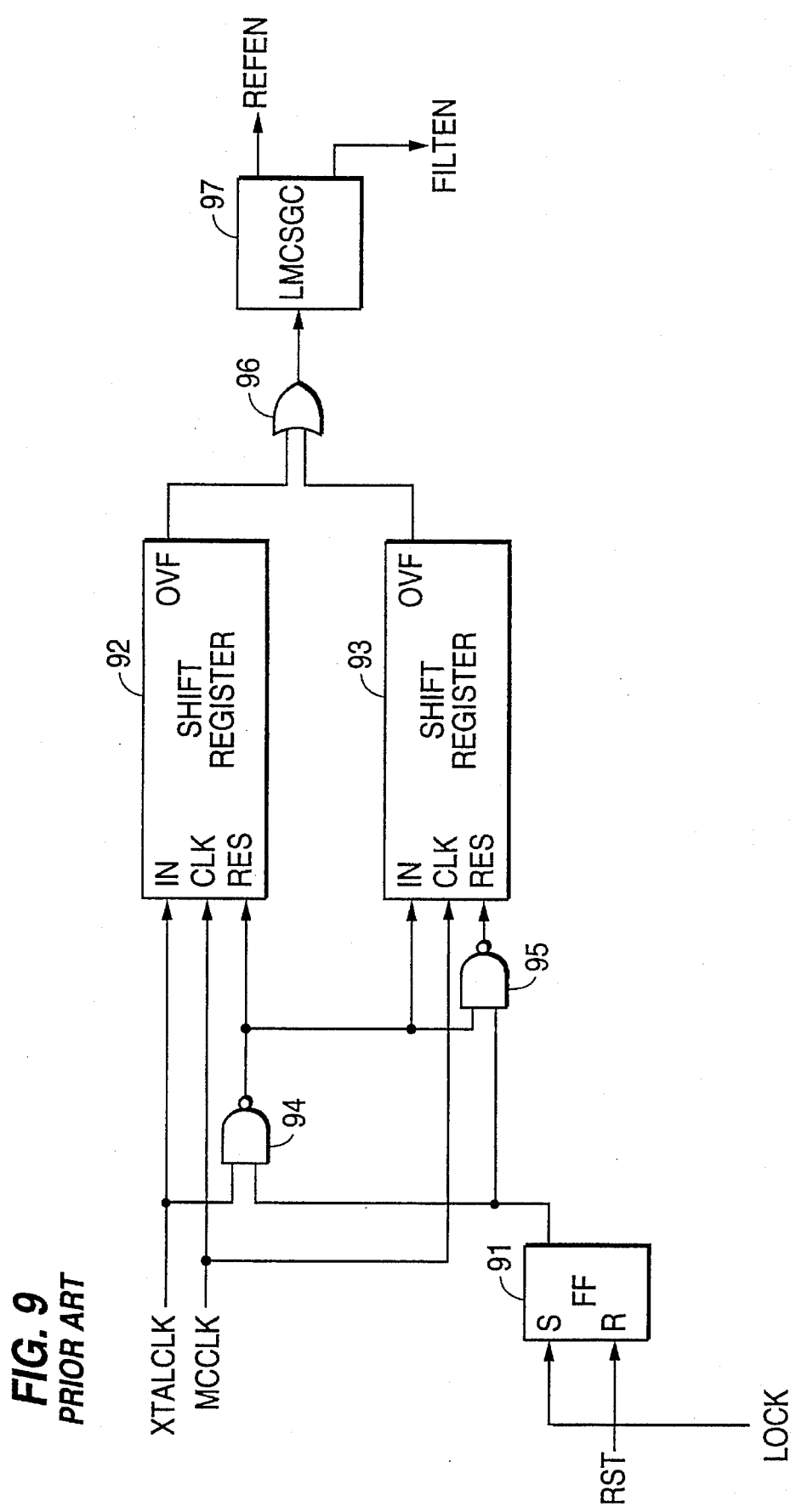
FIG. 9 is a circuit diagram of the conventional limp mode control circuit shown in FIG. 8.

Although the invention has been described by reference only to an embodiment, the invention is not limited to that case, and it is obvious that a similar effect can be obtained, for example, in the configuration method of the phase comparator if it has a means for detecting the state provided that the state of the phase comparator at the time of loss of the reference clock can be determined uniquely. It will become apparent to persons skilled in the art that various applications or modifications of the disclosed embodiment are possible as they fall within the true scope of the invention. For example, a voltage control circuit VCC may be connected between the LPF 15 and the VCO 16 and controlled by the signal XTALFAIL in a manner as described with reference to FIG. 8.

What is claimed is:

1. A semiconductor device comprising:

a phase locked loop circuit for generating a controlled clock signal in response to a reference clock signal and having a phase comparator, said phase comparator including a first node for receiving said reference clock signal, a second node for receiving said controlled clock signal, and a third node, said phase comparator outputting a first active level to said third node when said controlled clock signal has a different phase from said reference clock signal, and outputting a first inactive level to said third node when said controlled clock signal has a same phase as said reference clock signal;

a lock detection circuit connected to said third node for outputting a first control signal to a fourth node in response to a level of said third node, said first control signal being set to a second active level when said third node level is at said first active level and being set to a second inactive level when said third node level is at said first inactive level; and a reference clock loss detection circuit connected to said third node and said fourth node for outputting a second control signal to a fifth node, said second control signal being set to a third active level for indicating a loss of said reference clock signal when said first control signal remains at said second active level for a predetermined time period.

2. The semiconductor device as claimed in claim 1, wherein said reference clock loss detection circuit includes a shift register, said shift register connected to said third node and said fourth node and generating said second control signal by shifting said active level of said first control signal in response to said controlled clock signal.

3. The semiconductor device as claimed in claim 1, wherein said controlled clock signal and said second control signal are supplied to a data processing unit.

4. A semiconductor device comprising:

an oscillator for outputting a reference clock signal to a first node;

a phase locked loop circuit for generating a first controlled clock signal in response to said reference clock signal and including a phase comparator, a control voltage generator, a voltage control oscillator and a frequency divider, said phase comparator connected to said first node for receiving said reference clock signal, a second node for receiving said first controlled clock signal and a third node, said phase comparator outputting a first active level to said third node as an error signal when said first controlled clock signal has a different phase from said reference clock signal and outputting a first inactive level to said third node when said first controlled clock signal has a same phase as said reference clock signal;

said control voltage generator being connected between said third node and a fourth node for generating a control voltage in response to said error signal and outputting said control voltage to said fourth node;

said voltage control oscillator being connected between said fourth node and a fifth node for outputting a second controlled clock signal to said fifth node;

said frequency divider being connected between said fifth node and said second node for demultiplying said second controlled clock signal and outputting said demultiplied second controlled clock signal as said first controlled clock signal;

a lock detection circuit connected to said third node for outputting a first control signal to a sixth node in response to a level of said third node, said first control signal being set to a second active level when said third node level indicates said first active level and being set to a second inactive level when said third node level indicates said first inactive level; and a reference clock loss detection circuit connected to said third node and said sixth node for outputting a second control signal to a seventh node, said second control signal being set to a third active level for indicating a loss of said reference clock signal when said first control signal remains at said second active level during a predetermined time period.

5. The semiconductor device as claimed in claim 4, wherein said second controlled clock signal and said second control signal are supplied to a data processing unit.

6. A semiconductor device comprising:

a phase locked loop circuit for generating a controlled clock signal in response to a reference clock signal and having a phase comparator, said phase comparator including a first node for receiving said reference clock signal, a second node for receiving said controlled clock signal, a third node and a fourth node, said phase comparator outputting a first control clock signal to said third node when said controlled clock signal has a different phase in a first polarity with respect to said reference clock signal and outputting a second control clock signal to said fourth node when said controlled clock signal has a different phase in a second polarity opposite to said first polarity with respect to said reference clock signal, having active and inactive levels;

a lock detection circuit connected to said third node, said fourth node and a fifth node for outputting a first control signal to said fifth node in response to said first and second control clock signals, said first control signal being set to a first active level when each of said first and second control clock signals indicates said controlled clock signal having said different phase with respect to said reference clock signal and being set to an inactive level when both of said first and second control clock signals indicate said controlled clock signal having a same phase and said reference clock signal; and a reference clock loss detection circuit connected to said fourth node, said fifth node and a sixth node for outputting a second control signal to said sixth node, said second control signal being set to a second active level for indicating a loss of said reference clock signal when said first control signal remains at said first active level during a predetermined time period.

7. The semiconductor device as claimed in claim 6, wherein said reference clock loss detection circuit includes a shift register having a reset terminal, said shift register being connected to said second node and said sixth node, and a gate circuit connected to said fourth node, said fifth node and said reset terminal for resetting said shift register when said first control signal indicates said first active level and said second control clock signal indicates said inactive level, and for not resetting said shift register when said second control clock signal indicates said active level, wherein said shift register counts said controlled clock signal when said shift register is not reset by said gate circuit, and outputs said second control signal when said shift register overflows.

8. A semiconductor device as claimed in claim 1, wherein said first control signal indicates a phase lock condition of said phase locked loop circuit when said first control signal is set to said second inactive level.

9. A semiconductor device as claimed in claim 4, wherein said first control signal indicates a phase lock condition of said phase locked loop circuit when said first control signal is set to said second inactive level.

10. A semiconductor device as claimed in claim 6, wherein said first control signal indicates a phase lock condition of said phase locked loop circuit when said first control signal is set to said inactive level.

* * * * *